US011302572B2

(12) United States Patent
Kim et al.

(10) Patent No.: US 11,302,572 B2
(45) Date of Patent: Apr. 12, 2022

(54) SEMICONDUCTOR PACKAGE AND METHOD OF MANUFACTURING THE SAME

(71) Applicant: Samsung Electronics Co., Ltd., Suwon-si (KR)

(72) Inventors: Dowan Kim, Hwaseong-si (KR); Doohwan Lee, Cheonan-si (KR); Seunghwan Baek, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/983,298

(22) Filed: Aug. 3, 2020

(65) Prior Publication Data

US 2021/0202303 A1    Jul. 1, 2021

(30) Foreign Application Priority Data

Dec. 27, 2019    (KR) .................. 10-2019-0176504

(51) Int. Cl.
*H01L 21/768*    (2006.01)
*H01L 23/538*    (2006.01)
(Continued)

(52) U.S. Cl.
CPC .. *H01L 21/76802* (2013.01); *H01L 21/76877* (2013.01); *H01L 23/31* (2013.01);
(Continued)

(58) Field of Classification Search
CPC ..... H01L 2924/181; H01L 2224/04105; H01L 21/563; H01L 24/97; H01L 2924/1533;
(Continued)

(56) References Cited

U.S. PATENT DOCUMENTS

| 5,935,876 A | 8/1999 | Lee et al. |
| 7,569,481 B2 | 8/2009 | Nam |

(Continued)

FOREIGN PATENT DOCUMENTS

| KR | 100226727 B1 | 10/1999 |
| KR | 100537892 B1 | 12/2005 |

(Continued)

*Primary Examiner* — Bac H Au
(74) *Attorney, Agent, or Firm* — Harness, Dickey & Pierce, P.L.C.

(57) ABSTRACT

A method of manufacturing a semiconductor package may include forming a first substrate including a redistribution layer, providing a second substrate including a semiconductor chip and an interconnection layer on the first substrate to connect the semiconductor chip to the redistribution layer, forming a first encapsulation layer covering the second substrate, and forming a via structure penetrating the first encapsulation layer. The forming the via structure may include forming a first via hole in the first encapsulation layer, forming a photosensitive material layer in the first via hole, exposing and developing the photosensitive material layer in the first via hole to form a second encapsulation layer having a second via hole, and filling the second via hole with a conductive material. A surface roughness of a sidewall of the first encapsulation layer may be greater than a surface roughness of a sidewall of the second encapsulation layer.

17 Claims, 9 Drawing Sheets

(51) Int. Cl.
*H01L 23/00* (2006.01)
*H01L 23/31* (2006.01)

(52) U.S. Cl.
CPC ...... *H01L 23/5384* (2013.01); *H01L 23/5385* (2013.01); *H01L 23/5386* (2013.01); *H01L 24/94* (2013.01)

(58) Field of Classification Search
CPC ............ H01L 23/5389; H01L 23/3121; H01L 23/481; H01L 23/49827; H01L 23/5226; H01L 23/5383; H01L 23/5386; H01L 21/4857; H01L 21/76802; H01L 21/76877
See application file for complete search history.

(56) References Cited

U.S. PATENT DOCUMENTS

| | | | |
|---|---|---|---|
| 7,807,567 | B2 | 10/2010 | Kawano et al. |
| 8,264,086 | B2 | 9/2012 | Shue et al. |
| 8,368,231 | B2 | 2/2013 | Lee et al. |
| 9,318,442 | B1 | 4/2016 | Chen |
| 9,947,629 | B2* | 4/2018 | Hsu .......................... H01L 24/02 |
| 10,115,647 | B2 | 10/2018 | Huang et al. |
| 10,636,775 | B2* | 4/2020 | Chen ........................ H01L 25/50 |
| 10,665,549 | B2 | 5/2020 | Bae et al. |
| 10,756,015 | B2* | 8/2020 | Lee .................... H01L 21/76877 |
| 2006/0244131 | A1* | 11/2006 | Kobayashi .............. H01L 24/24 257/724 |
| 2011/0304054 | A1 | 12/2011 | Sakai |
| 2013/0075924 | A1* | 3/2013 | Lin ........................ H01L 23/293 257/774 |
| 2014/0048906 | A1* | 2/2014 | Shim ...................... H01L 25/105 257/531 |
| 2014/0217597 | A1* | 8/2014 | Lin .......................... H01L 24/97 257/773 |
| 2014/0264930 | A1* | 9/2014 | Yu ........................... H01L 24/13 257/774 |
| 2016/0163578 | A1* | 6/2016 | Yu ........................ H01L 21/6835 257/738 |
| 2017/0005074 | A1* | 1/2017 | Chen ..................... H01L 21/565 |
| 2017/0040265 | A1* | 2/2017 | Park ...................... H01L 21/4853 |
| 2017/0278812 | A1* | 9/2017 | Lee ....................... H01L 23/3114 |
| 2018/0082933 | A1* | 3/2018 | Ko ............................ H01L 23/16 |
| 2018/0145036 | A1* | 5/2018 | Kim ....................... H01L 23/295 |
| 2018/0226378 | A1* | 8/2018 | Hung ..................... H01L 24/83 |
| 2018/0247905 | A1* | 8/2018 | Yu .......................... H01L 24/20 |
| 2019/0006283 | A1* | 1/2019 | Wang ................ H01L 21/76834 |
| 2019/0189572 | A1* | 6/2019 | Chiang ................ H01Q 1/2283 |
| 2020/0006309 | A1* | 1/2020 | Chen .................... H01L 21/6835 |
| 2020/0105695 | A1* | 4/2020 | Hu ........................ H01L 21/565 |
| 2020/0135543 | A1* | 4/2020 | Wang ..................... H01L 24/19 |
| 2020/0279831 | A1* | 9/2020 | Chen ................ H01L 23/49816 |
| 2020/0365488 | A1* | 11/2020 | Yu .......................... H01L 24/17 |

FOREIGN PATENT DOCUMENTS

| | | |
|---|---|---|
| KR | 101708567 B1 | 2/2017 |
| KR | 101716031 B1 | 3/2017 |
| KR | 20200016624 A | 2/2020 |

* cited by examiner

SEMICONDUCTOR PACKAGE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0176504, filed on Dec. 27, 2019, in the Korean Intellectual Property Office, the disclosure of which is hereby incorporated by reference in its entirety.

BACKGROUND

Embodiments of inventive concepts relate to a semiconductor package and a method of manufacturing the same, and more particularly, to a semiconductor package including a via structure with improved electrical characteristics and a method of manufacturing the same.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. High-performance, high-speed and small electronic components have been increasingly demanded with the development of an electronic industry. Thus, a wafer-level package and a panel-level package are being studied.

SUMMARY

Embodiments of inventive concepts may provide a semiconductor package including a via structure with improved electrical characteristics and reliability and a method of manufacturing the same.

In an embodiment, a method of manufacturing a semiconductor package may include forming a first substrate including a redistribution layer, providing a second substrate including a semiconductor chip and an interconnection layer on the first substrate, forming a first encapsulation layer covering the second substrate, and forming a via structure penetrating the first encapsulation layer. The forming the via structure may include forming a first via hole in the first encapsulation layer, forming a photosensitive material layer provided in the first via hole and covering a top surface of the first encapsulation layer, exposing and developing the photosensitive material layer in the first via hole to form a second encapsulation layer having a second via hole, and filling the second via hole with a conductive material. A surface roughness of a sidewall of the first encapsulation layer may be greater than a surface roughness of a sidewall of the second encapsulation layer. The semiconductor chip may be electrically connected to the redistribution layer.

In an embodiment, a method of manufacturing a semiconductor package may include forming a first substrate including a redistribution layer, providing a second substrate including a semiconductor chip and an interconnection layer on the first substrate, forming a first encapsulation layer covering the second substrate, and forming a via structure penetrating the first encapsulation layer. The semiconductor chip may be electrically connected to the redistribution layer. The forming the via structure may include forming a first via hole in the first encapsulation layer, forming a photosensitive material layer provided in the first via hole and covering a top surface of the first encapsulation layer, exposing and developing the photosensitive material layer in the first via hole to form a second encapsulation layer having a second via hole, and filling the second via hole with a conductive material. A sidewall of the via structure may have a first surface and a second surface. The first surface of the sidewall of the via structure may be inclined with respect to a top surface of the second substrate. The second surface of the sidewall of the via structure may be inclined with respect to each of the first surface of the sidewall of the via structure and the top surface of the second substrate.

In an embodiment, a semiconductor package may include a lower insulating layer including an under-bump metal layer, a solder ball on a bottom surface of the lower insulating layer and connected to the under-bump metal layer, a first substrate on a top surface of the lower insulating layer and the first substrate including a redistribution layer, a second substrate including a semiconductor chip electrically connected to the redistribution layer and an interconnection layer, the second substrate having a through-hole exposing the redistribution layer in a region surrounding the semiconductor chip, a first encapsulation layer covering the second substrate and having a first via hole, a second encapsulation layer covering the first encapsulation layer and having a second via hole in the first via hole, a via structure filling the second via hole, and an upper insulating layer covering a portion of the via structure and a top surface of the second encapsulation layer. The first encapsulation layer may fill the through-hole. A diameter of the second via hole may be less than a diameter of the first via hole. A sidewall of the via structure may have a first surface and a second surface. The first surface of the sidewall of the via structure may be inclined with respect to a top surface of the second substrate. The second surface of the sidewall of the via structure may be inclined with respect to each of the first surface of the sidewall of the via structure and the top surface of the second substrate.

BRIEF DESCRIPTION OF THE DRAWINGS

Inventive concepts will become more apparent in view of the attached drawings and accompanying detailed description.

DETAILED DESCRIPTION

As used herein, the singular forms "a," "an" and "the" are intended to include the plural forms as well, unless the context clearly indicates otherwise. When the terms "about"

or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Semiconductor packages and methods of manufacturing the same according to some embodiments of inventive concepts will be described more fully hereinafter with reference to the accompanying drawings.

Figure 1:
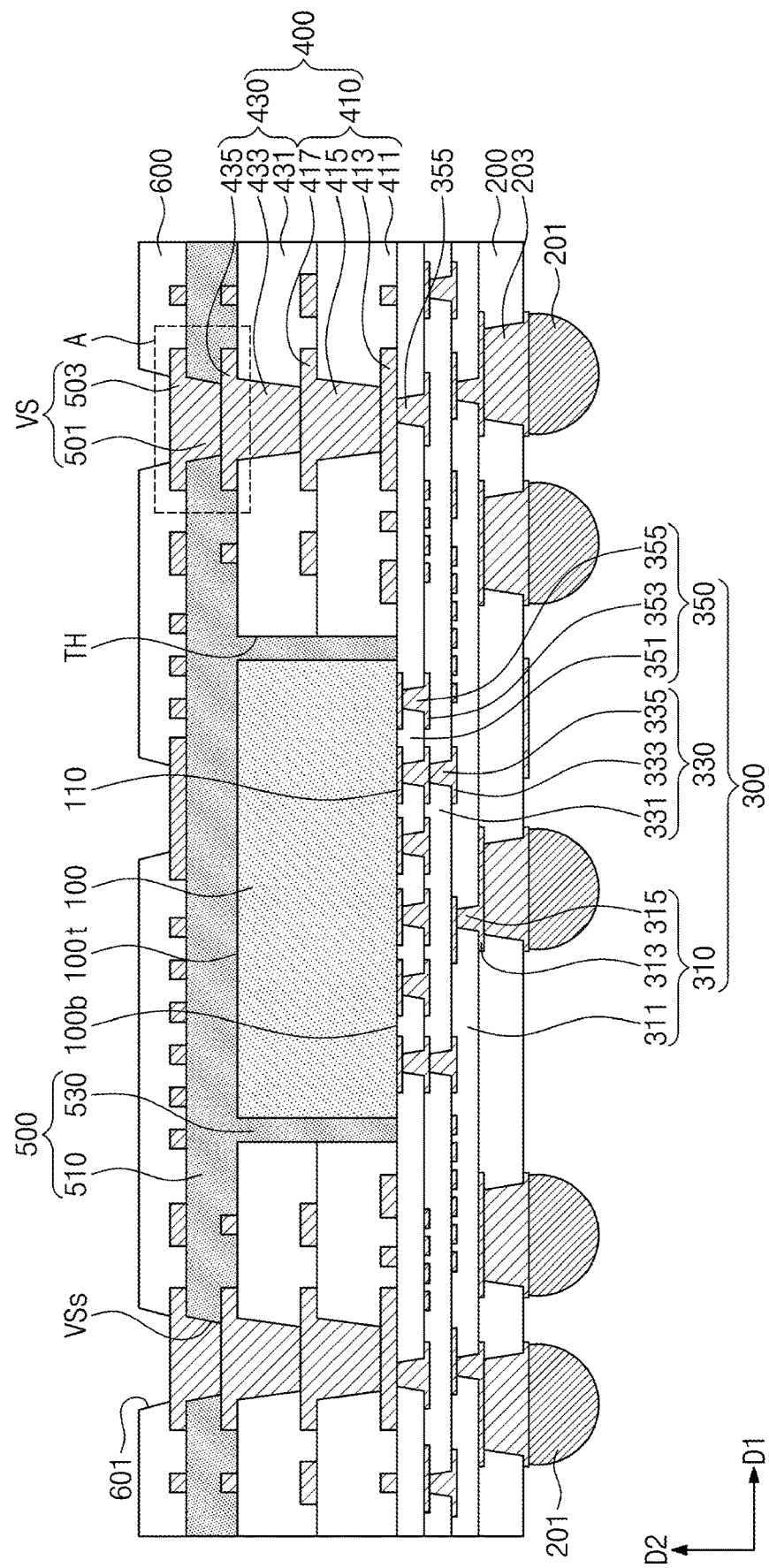
FIG. 1 is a cross-sectional view illustrating a semiconductor package according to some embodiments of inventive concepts.

FIG. 1 is a cross-sectional view illustrating a semiconductor package according to some embodiments of inventive concepts.

Referring to FIG. 1, a semiconductor package according to some embodiments of inventive concepts may include a lower insulating layer 200, a first substrate 300, a second substrate 400, a molding layer 500, and an upper insulating layer 600. The second substrate 400 may include a semiconductor chip 100. The semiconductor package according to some embodiments of inventive concepts may be a fan-out wafer-level package (FOWLP) or a fan-out panel-level package (FOPLP). In some embodiments, the semiconductor package may be one of unit packages obtained by dividing a package structure including a plurality of the semiconductor chips 100 through a singulation process (e.g., a dicing process using a dicing saw). In certain embodiments, the semiconductor package may have a structure in which fan-out packages are stacked, unlike FIG. 1.

A solder ball 201 may be provided on a bottom surface of the lower insulating layer 200. The solder ball 201 may be provided in plurality, and the plurality of solder balls 201 may be arranged in a first direction D1. For example, the first direction D1 may be parallel to a top surface of the lower insulating layer 200. Hereinafter, a top surface of a component may be defined as a surface facing a second direction D2, and a bottom surface of the component may be defined as a surface facing a direction opposite to the second direction D2. For example, the top surface of the lower insulating layer 200 may be a surface facing the semiconductor chip 100, and the bottom surface of the lower insulating layer 200 may be a surface opposite to the top surface. For example, the second direction D2 may be perpendicular to the top surface of the lower insulating layer 200. In other words, the first direction D1 and the second direction D2 may be perpendicular to each other. Each of the solder balls 201 may be electrically connected to an external terminal (e.g., a terminal of a main board of an electronic device). The lower insulating layer 200 may include an under-bump metal layer 203. The under-bump metal layer 203 may be surrounded by the lower insulating layer 200. A width of the under-bump metal layer 203 in the first direction D1 may decrease as a height or level in the second direction D2 increases. The under-bump metal layer 203 may be electrically connected to the first substrate 300.

The first substrate 300 may include at least one or more redistribution layers (RDL). For example, referring to FIG. 1, the first substrate 300 may include first to third redistribution layers 310, 330 and 350. A design of a connection position with the external terminal may be more flexible with the first to third redistribution layers 310, 330 and 350. However, embodiments of inventive concepts are not limited thereto. In certain embodiments, the semiconductor package may include a different number of the redistribution layers.

The first redistribution layer 310 may be provided on the top surface of the lower insulating layer 200. In other words, the first redistribution layer 310 may be disposed between the lower insulating layer 200 and the second redistribution layer 330. The first redistribution layer 310 may include a first insulating layer 311, a first redistribution pattern 313, and a first conductive via 315. For example, the first redistribution pattern 313 may be located at a lower level than the top surface of the lower insulating layer 200. The first redistribution pattern 313 may be electrically connected to the under-bump metal layer 203. The first conductive via 315 may be provided on the first redistribution pattern 313 and may be electrically connected to the first redistribution pattern 313. The first conductive via 315 may be surrounded by the first insulating layer 311.

The second redistribution layer 330 may be provided on a top surface of the first redistribution layer 310. In other words, the second redistribution layer 330 may be disposed between the first redistribution layer 310 and the third redistribution layer 350. The second redistribution layer 330 may include a second insulating layer 331, a second redistribution pattern 333, and a second conductive via 335. For example, the second redistribution pattern 333 may be located at a lower level than the top surface of the first redistribution layer 310. The second redistribution pattern 333 may be provided in plurality, and at least one of the plurality of second redistribution patterns 333 may be electrically connected to the first conductive via 315. The second conductive via 335 may be provided on the second redistribution pattern 333 and may be electrically connected to the second redistribution pattern 333. The second conductive via 335 may be surrounded by the second insulating layer 331.

The third redistribution layer 350 may be provided on a top surface of the second redistribution layer 330. In other words, the third redistribution layer 350 may be disposed between the second redistribution layer 330 and the second substrate 400. The third redistribution layer 350 may include a third insulating layer 351, a third redistribution pattern 353, and a third conductive via 355. For example, the third redistribution pattern 353 may be located at a lower level than the top surface of the second redistribution layer 330. The third redistribution pattern 353 may be provided in plurality, and at least one of the plurality of third redistribution patterns 353 may be electrically connected to the second conductive via 335. The third conductive via 355 may be provided on the third redistribution pattern 353 and may be electrically connected to the third redistribution pattern 353. The third conductive via 355 may be surrounded by the third insulating layer 351. In addition, the third conductive via 355 may be provided in plurality, some of the plurality of third conductive vias 355 may be electrically connected to connection pads 110 of the semiconductor chip 100, and others of the plurality of third conductive vias 355 may be electrically connected to the second substrate 400.

A width of each of the first to third conductive vias 315, 335 and 355 in the first direction D1 may decrease as a height or level in the second direction D2 increases. Each of the first to third insulating layers 311, 331 and 351 may include an insulating material. For example, each of the first to third insulating layers 311, 331 and 351 may include an inorganic material (e.g., silicon oxide, silicon nitride, and/or silicon oxynitride) and/or a polyamide-based polymer material. The first to third redistribution patterns 313, 333 and 353 and the first to third conductive vias 315, 335 and 355 may include a conductive material. The first to third redistribution patterns 313, 333 and 353 and the first to third conductive vias 315, 335 and 355 may include, for example, copper (Cu), a copper alloy, or aluminum (Al). Here, the copper alloy may mean an alloy obtained by mixing copper with a very small amount of C, Ag, Co, Ta, In, Sn, Zn, Mn, Ti, Mg, Cr, Ge, Sr, Pt, Al, or Zr.

In some embodiments, the first to third redistribution patterns 313, 333 and 353 and the first to third conductive vias 315, 335 and 355 may be formed through a plurality of damascene processes or dual damascene processes. Even though not shown in the drawings, barrier patterns may be provided between the first to third redistribution patterns 313, 333 and 353 and the first to third insulating layers 311, 331 and 351 and between the first to third conductive vias 315, 335 and 355 and the first to third insulating layers 311, 331 and 351, respectively. For example, the barrier patterns may include at least one of Ta, TaN, TaSiN, Ti, TiN, TiSiN, W, or WN.

The second substrate 400 may include the semiconductor chip 100 and first and second burying layers 410 and 430. However, embodiments of inventive concepts are not limited thereto. In certain embodiments, the semiconductor package may include a different number of the burying layers. The second substrate 400 may be, for example, an embedded trace substrate (ETS).

For example, the semiconductor chip 100 may be a logic chip, a memory chip, or an application processor chip. The semiconductor chip 100 may be disposed in a through-hole TH penetrating the first and second burying layers 410 and 430 and may be surrounded by the first and second burying layers 410 and 430, when viewed in a plan view. The semiconductor chip 100 may be spaced apart from the first and second burying layers 410 and 430 with a portion of the through-hole TH interposed therebetween, when viewed in a cross-sectional view. The semiconductor chip 100 may have a bottom surface 100b adjacent to the first substrate 300, and a top surface 100t opposite to the bottom surface 100b. For example, the bottom surface 100b of the semiconductor chip 100 may be an active surface, and the top surface 100t of the semiconductor chip 100 may be a non-active surface. The connection pad 110 may be provided on the bottom surface 100b of the semiconductor chip 100. The connection pad 110 may be provided in plurality, and the plurality of connection pads 110 may be arranged in the first direction D1. The number, a pitch and/or arrangement of the connection pads 110 may be changed depending on the numbers, pitches and/or arrangement of the first to third redistribution patterns 313, 333 and 353 and the number, a pitch and/or arrangement of the solder balls 201. For example, the connection pads 110 may be arranged more densely than the solder balls 201. The semiconductor chip 100 may be electrically connected to the solder balls 201 through the connection pads 110 and the first to third redistribution patterns 313, 333 and 353 and the first to third conductive vias 315, 335 and 355 of the first substrate 300. In addition, the semiconductor package according to some embodiments of inventive concepts may further include a passivation layer (not shown) covering the bottom surface 100b of the semiconductor chip 100 and a portion of a bottom surface of the connection pad 110. In certain embodiments, an interposer and an underfill material may be disposed between the semiconductor chip 100 and the connection pad 110, unlike FIG. 1.

The first burying layer 410 may be provided on a portion of a top surface of the third redistribution layer 350. In other words, the first burying layer 410 may be disposed between the first substrate 300 and the second burying layer 430. The first burying layer 410 may include a first burying insulating layer 411, a first conductive pattern 413, a first buried via 415, and a second conductive pattern 417. In some embodiments, the first and second conductive patterns 413 and 417 may correspond to interconnection layers. The first conductive pattern 413 may be provided on the top surface of the third redistribution layer 350 and may be electrically connected to the third conductive via 355. The first buried via 415 may be provided on the first conductive pattern 413. The first buried via 415 may be surrounded by the first burying insulating layer 411. For example, the second conductive pattern 417 may be located at a higher level than a top surface of the first burying insulating layer 411. The first conductive pattern 413, the first buried via 415 and the second conductive pattern 417 may be electrically connected to each other.

The second burying layer 430 may be provided on a top surface of the first burying layer 410. In other words, the second burying layer 430 may be disposed between the first burying layer 410 and the molding layer 500. The second burying layer 430 may include a second burying insulating layer 431, a second buried via 433, and a third conductive pattern 435. In some embodiments, the third conductive pattern 435 may correspond to an interconnection layer. The second buried via 433 may be provided on the second conductive pattern 417. The second buried via 433 may be surrounded by the second burying insulating layer 431. For example, the third conductive pattern 435 may be located at a higher level than a top surface of the second burying insulating layer 431. The second buried via 433 and the third conductive pattern 435 may be electrically connected to each other and may be electrically connected to the first conductive pattern 413, the first buried via 415, and the second conductive pattern 417.

A width of each of the first and second buried vias 415 and 433 in the first direction D1 may increase as a height or level in the second direction D2 increases. The first and second burying insulating layers 411 and 431 may include an insulating material. In some embodiments, the first and second burying insulating layers 411 and 431 may include substantially the same material as the first to third insulating layers 311, 331 and 351 of the first substrate 300. In certain embodiments, the first and second burying insulating layers 411 and 431 may include a different insulating material from those of the first to third insulating layers 311, 331 and 351 of the first substrate 300. For example, the first and second burying insulating layers 411 and 431 may include a thermosetting resin (e.g., an epoxy resin), a thermoplastic resin (e.g., polyimide), or an insulating material in which the resin is impregnated into a core material (e.g., an inorganic filler and/or a glass fiber (or glass cloth or glass fabric)), e.g., prepreg, an Ajinomoto build-up film (ABF), FR-4, or bismaleimide triazine (BT). The first conductive pattern 413, the first buried via 415, the second conductive pattern 417, the second buried via 433 and the third conductive pattern 435 may include a conductive material. For example, the first conductive pattern 413, the first buried via 415, the second conductive pattern 417, the second buried via 433 and the third conductive pattern 435 may include copper (Cu), a copper alloy, or aluminum (Al).

The molding layer 500 may cover the semiconductor chip 100 and the second substrate 400. In addition, the molding layer 500 may fill the through-hole TH around the semiconductor chip 100. The molding layer 500 may include a first portion 510 covering the top surface 100t of the semiconductor chip 100 and a top surface of the second burying layer 430 and extending in the first direction D1, and a second portion 530 filling the through-hole TH and extending in the second direction D2. In other words, the semiconductor chip 100 may be spaced apart from the first and second burying layers 410 and 430 with the second portion 530 of the molding layer 500 interposed therebetween. For example, the molding layer 500 may include an insulating polymer (e.g., an epoxy-based polymer) or an Ajinomoto build-up film (ABF).

A via structure VS penetrating the molding layer 500 may be provided. The via structure VS may include an upper conductive via 501 and an upper conductive pad 503. A width of the upper conductive via 501 in the first direction D1 may increase as a height or level in the second direction D2 increases. In other words, a sidewall VSs of the via structure VS may have a gradient with respect to the top surface of the first substrate 300 and the top surface of the second substrate 400. The upper conductive pad 503 may be provided in plurality, and one or some of the plurality of upper conductive pads 503 may not be connected to the upper conductive via 501. The via structure VS and a method of manufacturing the same will be described in more detail with reference to FIGS. 2 to 11.

The upper insulating layer 600 may cover the molding layer 500 and a portion of the upper conductive pad 503 of the via structure VS. The upper insulating layer 600 may have an opening 601 exposing another portion of the upper conductive pad 503. A width of the opening 601 in the first direction D1 may increase as a height or level in the second direction D2 increases.

A method of manufacturing a semiconductor package according to some embodiments of inventive concepts may include forming a first substrate 300 including first to third redistribution layers 310, 330 and 350, providing a second substrate 400 including a semiconductor chip 100 and first to third conductive patterns 413, 417 and 435 on the first substrate 300 to electrically connect the semiconductor chip 100 to the first to third redistribution layers 310, 330 and 350 of the first substrate 300, forming a molding layer 500 covering the second substrate 400, and forming a via structure VS penetrating the molding layer 500.

The first substrate 300 including the first to third redistribution layers 310, 330 and 350, the lower insulating layer 200 including the under-bump metal layer 203, and the solder balls 201 may be formed on a carrier substrate. Thereafter, the carrier substrate may be removed, and the second substrate 400 including the semiconductor chip 100 may be formed on the top surface of the first substrate 300. In other words, the top surface of the first substrate 300 may be in contact with the bottom surface 100b of the semiconductor chip 100.

A process of forming the through-hole TH penetrating the second substrate 400 may be performed between the process of forming the second substrate 400 and the process of forming the molding layer 500. More particularly, the through-hole TH may penetrate the first and second burying layers 410 and 430 adjacent to the semiconductor chip 100. The through-hole TH may be formed to surround the semiconductor chip 100. Thereafter, the molding layer 500 may be formed to fill the through-hole TH.

The formation of the via structure VS penetrating the molding layer 500 will be described later in detail with reference to FIGS. 4 to 10.

Figure 2:
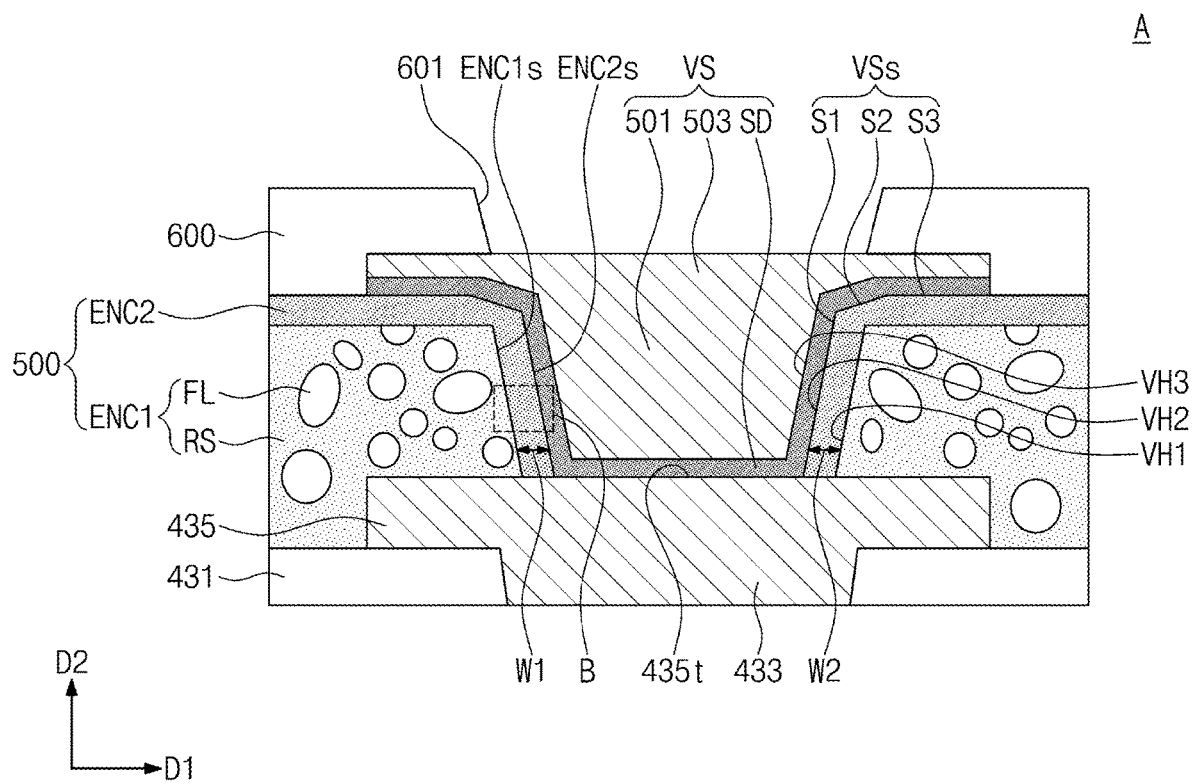
FIG. 2 is an enlarged view of a portion 'A' of FIG. 1 to illustrate a via structure of a semiconductor package according to some embodiments of inventive concepts.

FIG. 2 is an enlarged view of a portion 'A' of FIG. 1 to illustrate a via structure of a semiconductor package according to some embodiments of inventive concepts.

Referring to FIG. 2, the molding layer 500 and the via structure VS are illustrated. The molding layer 500 may include a first encapsulation layer ENC1 and a second encapsulation layer ENC2. The via structure VS may include the upper conductive via 501, the upper conductive pad 503, and a seed layer SD.

The first encapsulation layer ENC1 may cover the top surface of the second burying insulating layer 431 and at least a portion of a top surface 435t of the third conductive pattern 435. The top surface 435t of the third conductive pattern 435 may be substantially flat. In addition, the top surface 435t of the third conductive pattern 435 may be substantially parallel to the top surface of the second burying insulating layer 431. A space surrounded by a sidewall ENC1s of the first encapsulation layer ENC1 may be defined as a first via hole VH1. The sidewall EN1s of the first encapsulation layer ENC1 may have a gradient with respect to the top surface 435t of the third conductive pattern 435. In other words, a width of the first via hole VH1 in the first direction D1 may increase as a height or level in the second direction D2 increases. The first encapsulation layer ENC1 may be an adhesive insulating film. For example, the first encapsulation layer ENC1 may include an insulating resin RS and a plurality of fillers FL in the insulating resin RS. The insulating resin RS may include, for example, a polymer material such as epoxy or polyimide. The fillers FL may include, for example, an inorganic material such as silica. The fillers FL may be atypical and may be randomly dispersed in the insulating resin RS. However, embodiments of inventive concepts are not limited thereto. In certain embodiments, the first encapsulation layer ENC1 may not include the fillers FL but may include only the insulating resin RS.

The second encapsulation layer ENC2 may cover the sidewall ENC1s and a top surface of the first encapsulation layer ENC1. A space surrounded by a sidewall ENC2s of the second encapsulation layer ENC2 may be defined as a second via hole VH2. Here, the sidewall ENC2s of the second encapsulation layer ENC2 may be a surface which is not in contact with the first encapsulation layer ENC1. At the same level, a diameter of the second via hole VH2 may be less than a diameter of the first via hole VH1. The sidewall ENC2s of the second encapsulation layer ENC2 may be in contact with the sidewall VSs of the via structure VS. In other words, a profile of the sidewall ENC2s of the second encapsulation layer ENC2 may be substantially the same as a profile of the sidewall VSs of the via structure VS. A width W1 (W2) of the second encapsulation layer ENC2 in the first direction D1 may be constant in the first via hole VH1. The width W1 (W2) of the second encapsulation layer ENC2 in the first direction D1 may range from about 5 μm to about 20 μm. In FIG. 2, the width W1, in the first direction D1, of the second encapsulation layer ENC2 provided at a left side of the via structure VS may be substantially equal to the width W2, in the first direction D1, of the second encapsulation layer ENC2 provided at a right side of the via structure VS. However, the second encapsulation layers ENC2 respectively provided at the left and right sides of the via structure VS may be connected to each other to surround the via structure VS, when viewed in a plan view. In addition, under a level of the top surface of the first encapsulation layer ENC1, the width W1 or W2 of the second encapsulation layer ENC2 in the first direction D1 may be constant as a level in the second direction D2 increases. The second encapsulation layer ENC2 may include, for example, a photo-imageable dielectric resin. For example, the second encapsulation layer ENC2 may include at least one of photosensitive polyimide (PSPI), polybenzoxazole (PBO), a phenolic polymer, or a benzocyclobutene-based polymer (BCB).

The seed layer SD may conformally cover the top surface 435t of the third conductive pattern 435 exposed by the second via hole VH2, the sidewall ENC2s of the second encapsulation layer ENC2 exposed by the second via hole VH2, and a portion of the top surface of the second encapsulation layer ENC2. The seed layer SD may be spaced apart from the first encapsulation layer ENC1 with the second encapsulation layer ENC2 interposed therebetween. A space surrounded by a sidewall of the seed layer SD may be defined as a third via hole VH3. Here, the sidewall of the seed layer SD may be a surface which is not in contact with the second encapsulation layer ENC2. A bottom surface of the third via hole VH3 may be spaced apart from the top surface 435t of the third conductive pattern 435 in the second direction D2. At the same level, a diameter of the third via hole VH3 may be less than the diameter of the second via hole VH2. The seed layer SD may be disposed between the upper conductive via 501 and the second encapsulation layer ENC2 and between the upper conductive pad 503 and the second encapsulation layer ENC2. The seed layer SD may assist the formation of the upper conductive via 501 and the upper conductive pad 503. For example, the seed layer SD may increase uniformity of plating and may function as initial nucleation sites. For example, the seed layer SD may include at least one of copper (Cu), nickel (Ni), silver (Ag), gold (Au), aluminum (Al), tungsten (W), platinum (Pt), palladium (Pd), or any alloy thereof. In particular, the seed layer SD may include platinum (Pt).

The upper conductive via 501 and the upper conductive pad 503 may be provided on the seed layer SD. The upper conductive via 501 may fill the third via hole VH3. A width of the upper conductive via 501 in the first direction D1 may increase as a height or level in the second direction D2 increases. The upper conductive pad 503 may be provided on the upper conductive via 501 and the seed layer SD and may extend in the first direction D1. In addition, a portion of the top surface of the upper conductive pad 503 may be exposed by the opening 601 of the upper insulating layer 600. The upper conductive via 501 and the upper conductive pad 503 may include, for example, copper (Cu), a copper alloy, or aluminum (Al).

A profile of the sidewall VSs of the via structure VS will be described hereinafter in detail. The sidewall VSs of the via structure VS may have a first surface S1, a second surface S2, and a third surface S3. More particularly, the first surface S1 may be inclined with respect to the top surface 435t of the third conductive pattern 435. The second surface S2 may be inclined with respect to each of the first surface S1 and the top surface 435t of the third conductive pattern 435. An acute angle between the second surface S2 and the top surface 435t of the third conductive pattern 435 may be greater than 0 degree. An acute angle between the first surface S1 and the top surface 435t of the third conductive pattern 435 may be greater than the acute angle between the second surface S2 and the top surface 435t of the third conductive pattern 435. The third surface S3 may be substantially parallel to the top surface 435t of the third conductive pattern 435 and the first direction D1 in which the upper conductive pad 503 extends.

The sidewall VSs of the via structure VS may be spaced apart from the first encapsulation layer ENC1 with the second encapsulation layer ENC2 interposed therebetween. In the first via hole VH1, a distance between the first surface S1 and the first encapsulation layer ENC1 in the first direction D1 may be equal to the width W1 or W2 of the second encapsulation layer ENC2 in the first direction D1. In other words, the distance between the first surface S1 and the first encapsulation layer ENC1 in the first direction D1 may be constant in the first via hole VH1. In addition, a distance between the third surface S3 and the first encapsulation layer ENC1 in the second direction D2 may be constant. However, a distance between the second surface S2 and the first encapsulation layer ENC1 may not be constant. For example, a corner of the first encapsulation layer ENC1 may be the closest to the second surface S2.

According to the embodiments of inventive concepts, the via structure VS may have the first surface S1 and the second surface S2 which have different gradients with respect to the top surface 435t of the third conductive pattern 435, and thus a cross-sectional area of the via structure VS may be increased. As a result, an electrical resistance of the via structure VS may be reduced. In addition, stress may be dispersed at a contact portion of the upper conductive via 501 and the upper conductive pad 503 of the via structure VS, and thus it is possible to prevent a crack from occurring at the contact portion. In other words, electrical characteristics and reliability of the semiconductor package may be improved by the via structure VS according to the embodiments of inventive concepts.

The via structure VS according to the embodiments of inventive concepts may be applied to various semiconductor packages having different structures from the structure illustrated in FIGS. 1 and 2. In particular, the via structure VS according to the embodiments of inventive concepts may be variously applied to semiconductor packages using an Ajinomoto build-up film (ABF) as a molding member.

Figure 3:
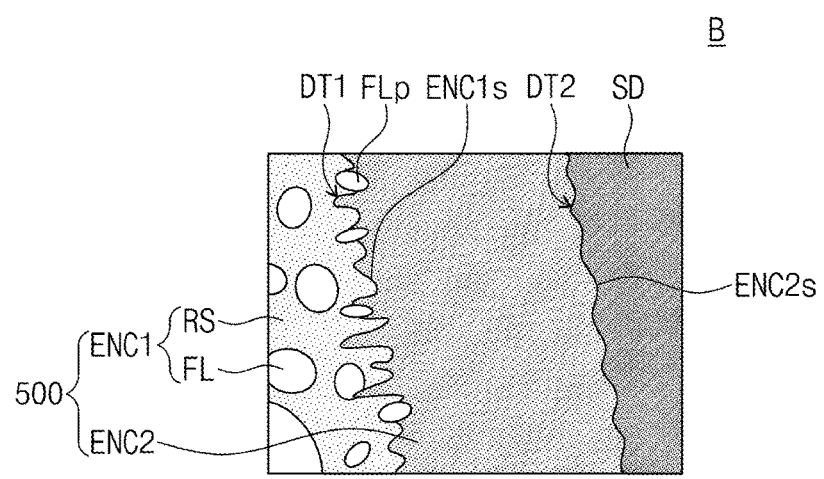
FIG. 3 is an enlarged view of a portion 'B' of FIG. 2 to illustrate a portion of a via structure of a semiconductor package according to some embodiments of inventive concepts.

FIG. 3 is an enlarged view of a portion 'B' of FIG. 2 to illustrate a portion of a via structure of a semiconductor package according to some embodiments of inventive concepts.

Referring to FIG. 3, the sidewall ENC1s of the first encapsulation layer ENC1 may be compared with the sidewall ENC2s of the second encapsulation layer ENC2. The sidewall ENC1s of the first encapsulation layer ENC1 and the sidewall ENC2s of the second encapsulation layer ENC2 may include concave portions DT1 and concave portions DT2, respectively. An average depth of the concave portions DT1 of the sidewall ENC1s of the first encapsulation layer ENC1 may be greater than an average depth of the concave portions DT2 of the sidewall ENC2s of the second encapsulation layer ENC2. In addition, at least one of the fillers FL of the first encapsulation layer ENC1 may include a protrusion FLp protruding from the sidewall ENC1s of the first encapsulation layer ENC1. Thus, a surface roughness of the sidewall ENC1s of the first encapsulation layer ENC1 may be greater than a surface roughness of the sidewall ENC2s of the second encapsulation layer ENC2.

FIGS. 4 to 10 are enlarged views corresponding to the portion 'A' of FIG. 1 to illustrate a method of manufacturing a via structure of a semiconductor package according to some embodiments of inventive concepts.

Figure 4:
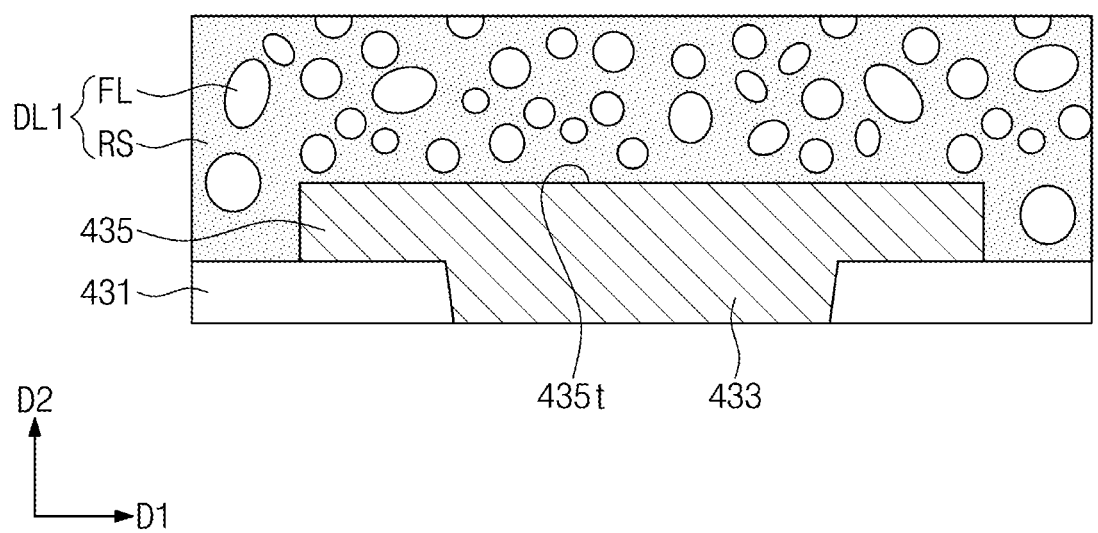
FIGS. 4 to 10 are enlarged views corresponding to the portion 'A' of FIG. 1 to illustrate a method of manufacturing a via structure of a semiconductor package according to some embodiments of inventive concepts.

Referring to FIG. 4, a first dielectric layer DL1 may be formed on the top surface of the second burying insulating layer 431 and the top surface 435t of the third conductive pattern 435. The first dielectric layer DL1 may completely cover the top surface 435t of the third conductive pattern 435. For example, the first dielectric layer DL1 may include an insulating resin RS and a plurality of fillers FL in the insulating resin RS.

Figure 5:
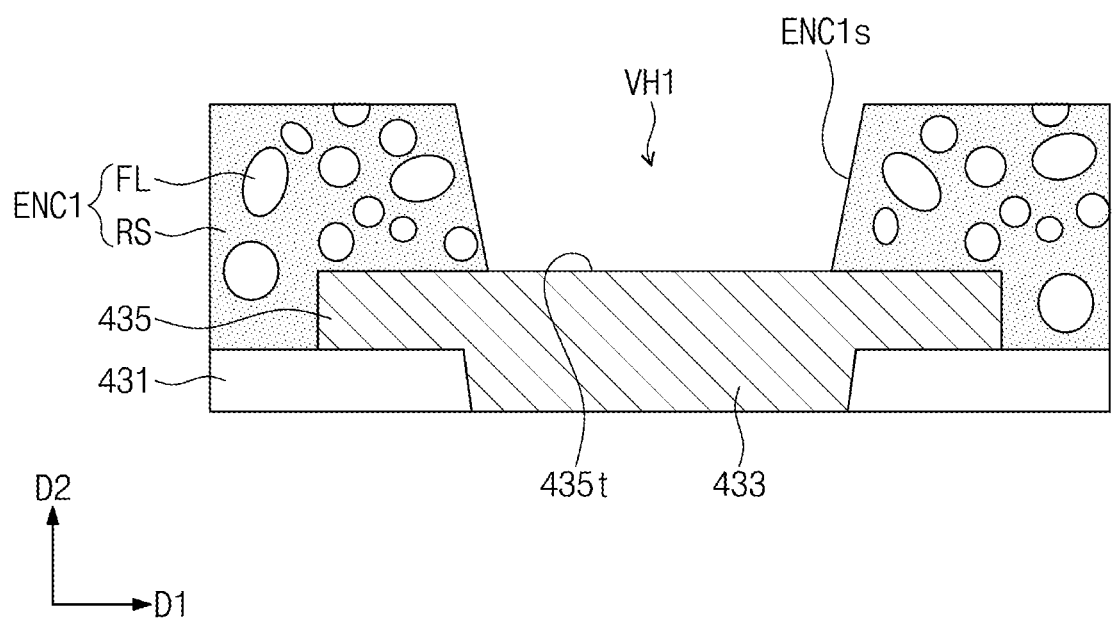

Referring to FIGS. 4 and 5, the first dielectric layer DL1 may be processed to form a first encapsulation layer ENC1 having a first via hole VH1. The processing of the first dielectric layer DL1 may be performed by a laser process. More particularly, the processing of the first dielectric layer DL1 may be performed by an etching process such as a drilling process, a laser ablation process, or a laser cutting process. At this time, predetermined alignment algorithm may be used to determine a laser processing position (i.e., a formation position of the first via hole VH1) on the first dielectric layer DL1.

The first via hole VH1 may be defined by a portion of the top surface 435t of the third conductive pattern 435 and a sidewall ENC1s of the first encapsulation layer ENC1. The portion of the top surface 435t of the third conductive pattern 435 may be exposed by the first via hole VH1. The sidewall ENC1s of the first encapsulation layer ENC1 may have a gradient with respect to the top surface 435t of the third conductive pattern 435. In other words, a width of the first via hole VH1 in the first direction D1 may increase as a height or level in the second direction D2 increases. The gradient of the sidewall ENC1s of the first encapsulation layer ENC1 may be substantially constant. In other words, the first encapsulation layer ENC1 may have a single corner at an upper portion of the first via hole VH1.

After the formation of the first encapsulation layer ENC1, a desmear process may further be performed on the portion of the top surface 435t of the third conductive pattern 435 and the sidewall ENC1s of the first encapsulation layer ENC1. Residues of the first dielectric layer DL1, which remain on the top surface 435t of the third conductive pattern 435, may be removed through the desmear process. In addition, portions of the fillers FL, which protrude from the sidewall ENC1s of the first encapsulation layer ENC1, may be removed through the desmear process. However, after the desmear process, some of the fillers FL of the first encapsulation layer ENC1 may include protrusions FLp protruding from the sidewall ENC1s of the first encapsulation layer ENC1. The surface roughness of the sidewall ENC1s of the first encapsulation layer ENC1 like FIG. 3 may be formed through the desmear process.

Figure 6:
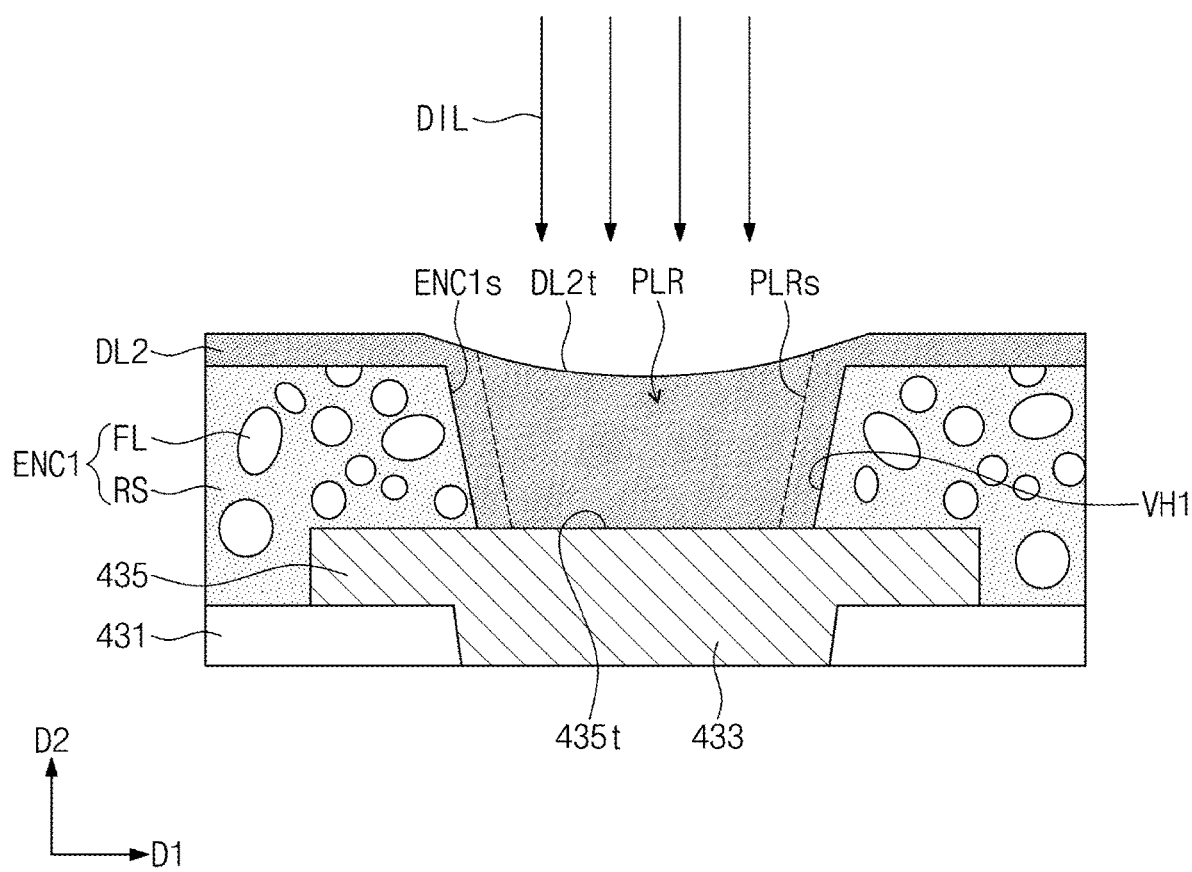

Referring to FIG. 6, a second dielectric layer DL2 may be formed on the third conductive pattern 435 and the first encapsulation layer ENC1. The second dielectric layer DL2 may include a photosensitive material. In other words, the second dielectric layer DL2 may be a photosensitive material layer. The second dielectric layer DL2 may fill the first via hole VH1. A top surface DL2t of the second dielectric layer DL2 may be concave in a partial region. The concave region of the top surface DL2t of the second dielectric layer DL2 may overlap with the first via hole VH1 in the second direction D2. The second dielectric layer DL2 may be formed by a coating process.

Thereafter, an exposure process may be performed on a partial region of the second dielectric layer DL2. An exposure region PLR of the second dielectric layer DL2 may be a specific region in the first via hole VH1. In other words, laser light DIL may be incident on the specific region in the first via hole VH1. A side surface PLRs of the exposure region PLR may be spaced apart from the sidewall ENC1s of the first encapsulation layer ENC1. The side surface PLRs of the exposure region PLR may have a gradient with respect to the top surface 435t of the third conductive pattern 435. The gradient of the side surface PLRs of the exposure region PLR may be substantially the same as the gradient of the sidewall ENC1s of the first encapsulation layer ENC1.

The exposure process may be performed by, for example, a laser direct imaging (LDI) exposure apparatus or an ultraviolet direct imaging (UVDI) exposure apparatus. The exposure process by the LDI exposure apparatus or the UVDI exposure apparatus may be performed without a photomask. For example, the LDI exposure apparatus or the UVDI exposure apparatus may determine a position of the exposure region on the basis of predetermined coordinates without a photomask. At this time, alignment algorithm which is substantially the same as the alignment algorithm used to form the first via hole VH1 in FIG. 5 may be used to determine the position of the exposure region. The exposure process using the LDI exposure apparatus or the UVDI exposure apparatus may have high speed, high accuracy and excellent alignment characteristics as compared with a general exposure process using a photomask. An edge of a wafer may be contracted or expanded in a heat treatment process performed on the wafer (or a panel) including a semiconductor package. However, the LDI exposure apparatus or the UVDI exposure apparatus may determine the position of the exposure region matched with the contracted or expanded wafer, and thus the alignment characteristic thereof may be excellent. In addition, the exposure process using the LDI exposure apparatus or the UVDI exposure apparatus may use the same alignment algorithm as the laser process of forming the first via hole VH1, and thus the alignment characteristic may be more improved.

The LDI exposure apparatus may use a single-wavelength laser. For example, a wavelength of the laser light DIL used in the LDI exposure apparatus may be selected from a range of 380 nm to 420 nm. Meanwhile, the laser light DIL used in the UVDI exposure apparatus may have a wavelength band. For example, the UVDI exposure apparatus may use the laser light DIL having a wavelength band of 300 nm to 500 nm. In addition, for example, the laser light DIL used in the UVDI exposure apparatus may have a peak at a specific wavelength in the wavelength band. Referring again to FIG. 2, a profile of a sidewall VSs of a via structure VS to be formed later may be controlled depending on a wavelength and an intensity of the laser light DIL used in the exposure process. Hereinafter, FIGS. 6 to 10 illustrate a case in which the exposure process is performed by the LDI exposure apparatus, and FIG. 11 illustrates a case in which the exposure process is performed by the UVDI exposure apparatus.

Figure 7:
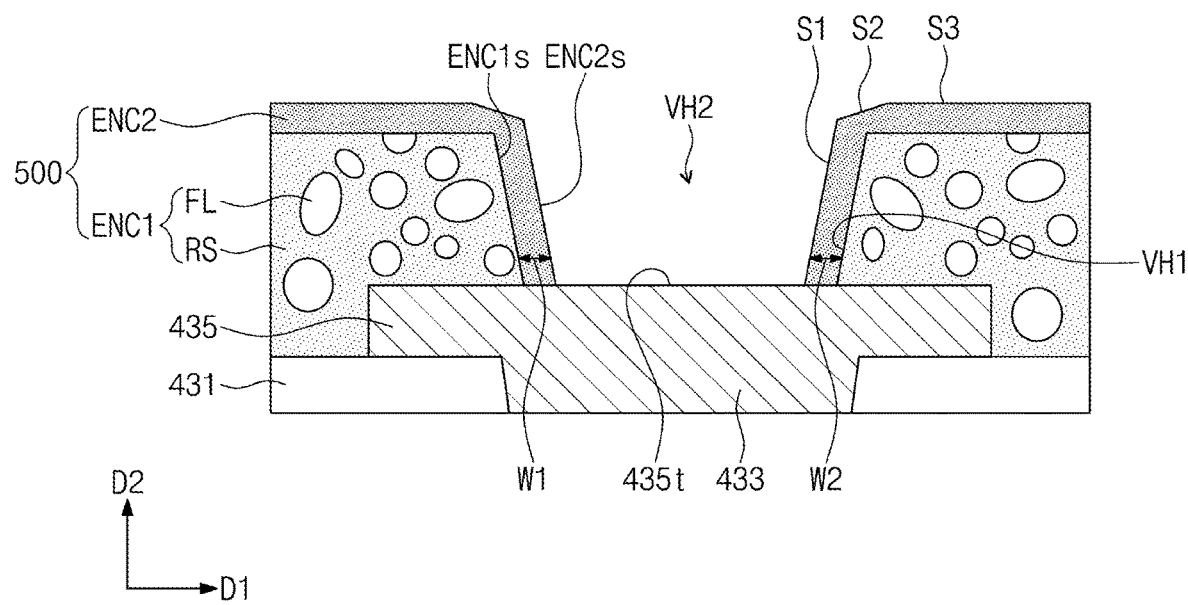

Referring to FIGS. 6 and 7, the second dielectric layer DL2 exposed by the exposure process may be developed to form a second encapsulation layer ENC2 having a second via hole VH2. A sidewall ENC2s of the second encapsulation layer ENC2 may be substantially the same as the side surface PLRs of the exposure region illustrated in FIG. 6. The second via hole VH2 may be defined by a portion of the top surface 435t of the third conductive pattern 435 and the sidewall ENC2s of the second encapsulation layer ENC2. The portion of the top surface 435t of the third conductive pattern 435 may be exposed by the second via hole VH2. The sidewall ENC2s of the second encapsulation layer ENC2 may have a gradient with respect to the top surface 435t of the third conductive pattern 435. In other words, a width of the second via hole VH2 in the first direction D1 may increase as a height or level in the second direction D2 increases. A central axis of the second via hole VH2 may be substantially the same as a central axis of the first via hole VH1. Thus, a width W1 (W2) of the second encapsulation layer ENC2 in the first direction D1 may be substantially constant in the first via hole VH1. The width W1 (W2) of the second encapsulation layer ENC2 in the first direction D1 may be minimized by the exposure process using the LDI exposure apparatus or the UVDI exposure apparatus. Thus, a degree of freedom of a position design of the via structure VS (see FIG. 2) to be formed later may be increased, and it is possible to prevent a crack from occurring at the sidewall ENC2s of the second encapsulation layer ENC2.

The sidewall ENC2s of the second encapsulation layer ENC2 may have surfaces having different gradients with respect to the top surface 435t of the third conductive pattern 435. In more detail, a first surface S1 may be inclined with respect to the top surface 435t of the third conductive pattern 435, and a second surface S2 may be inclined with respect to each of the first surface S1 and the top surface 435t of the third conductive pattern 435. An acute angle between the second surface S2 and the top surface 435t of the third conductive pattern 435 may be greater than 0 degree. An acute angle between the first surface S1 and the top surface 435t of the third conductive pattern 435 may be greater than the acute angle between the second surface S2 and the top surface 435t of the third conductive pattern 435. In other words, the second encapsulation layer ENC2 may have two corners in the second via hole VH2. The gradient of the second surface S2 may be due to the concave portion of the top surface DL2t of the second dielectric layer DL2 in FIG. 6. In addition, a top surface of the second encapsulation layer ENC2 may be defined as a third surface S3. The third surface S3 may be substantially parallel to the first direction D1 in which the top surface 435t of the third conductive pattern 435 extends.

After the formation of the second encapsulation layer ENC2, a plasma treatment process may further be performed on the portion of the top surface 435t of the third conductive pattern 435. Residues of the second dielectric layer DL2, which remain on the top surface 435t of the third conductive pattern 435, may be removed through the plasma treatment process.

Figure 8:
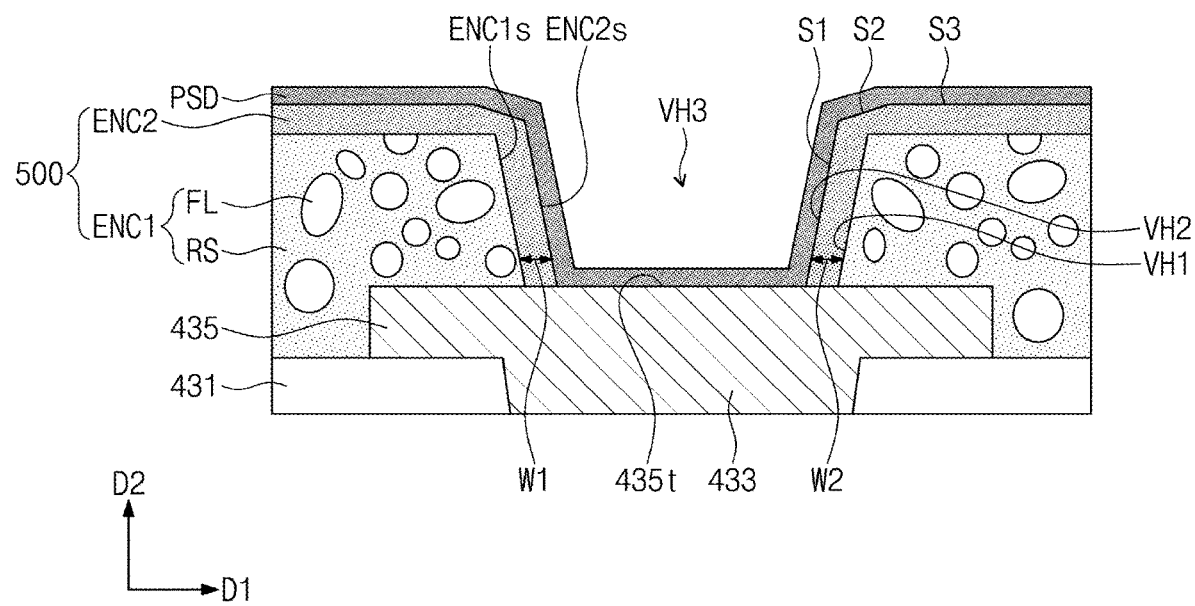

Referring to FIG. 8, a seed metal layer PSD may be formed to conformally cover the top surface 435t of the third conductive pattern 435 and the sidewall ENC2s and the top surface of the second encapsulation layer ENC2. A space surrounded by the seed metal layer PSD may be defined as a third via hole VH3. A thickness of the seed metal layer PSD may be substantially constant. Thus, a profile of a sidewall of the seed metal layer PSD may be substantially the same as a profile of the sidewall ENC2s of the second encapsulation layer ENC2. The seed metal layer PSD may be formed by, for example, a sputtering process. Since the seed metal layer PSD is formed by the sputtering process, the thin seed metal layer PSD may be easily formed to easily realize a fine pattern. In addition, the sputtering process may not use a harmful material and thus may be environmentally friendly.

Figure 9:
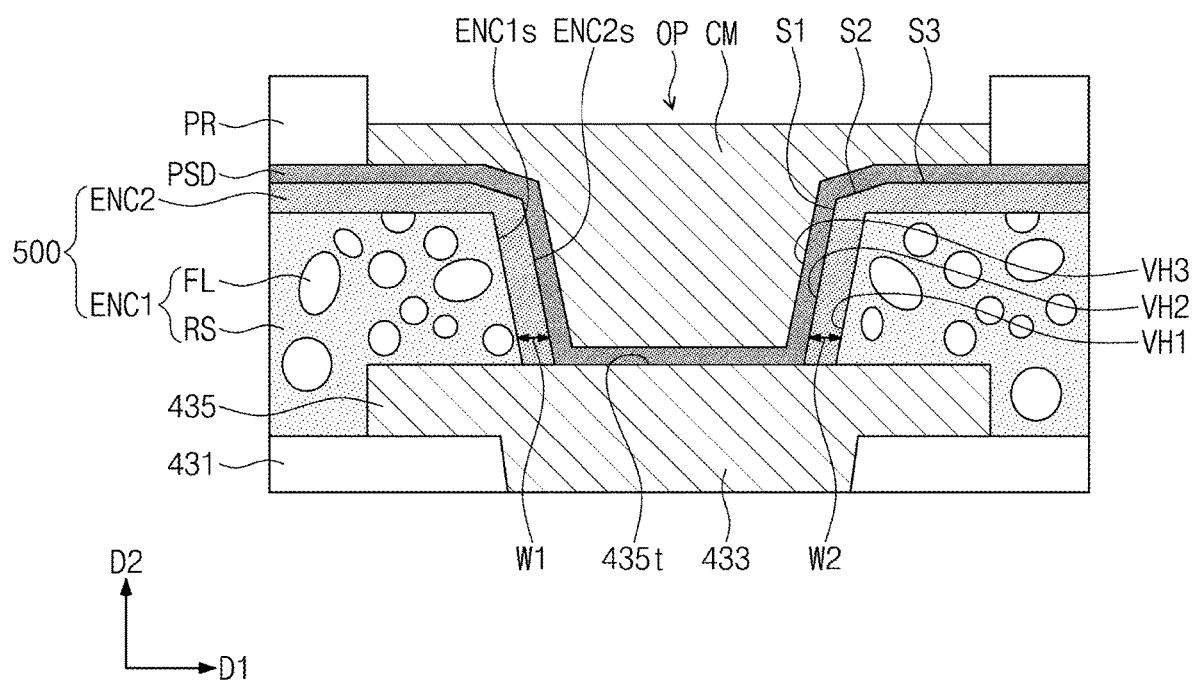

Referring to FIG. 9, a photoresist pattern PR may be formed on the seed metal layer PSD outside the third via hole VH3. An open hole OP may be surrounded by the photoresist pattern PR. A conductive material CM may fill the third via hole VH3 through the open hole OP and then may fill at least a portion of the open hole OP. The photoresist pattern PR may be formed by a photolithography process. The conductive material CM may be formed on the seed metal layer PSD by a plating process. For example, the plating process may be performed by an electroplating method or an electroless plating method. The seed metal layer PSD and the conductive material CM may completely fill the second via hole VH2. The seed metal layer PSD may assist growth of the conductive material CM. A top surface of the conductive material CM may be located at a higher level than the topmost surface of the seed metal layer PSD. In addition, the top surface of the conductive material CM may be located at a lower level than a top surface of the photoresist pattern PR. The photoresist pattern PR may be removed after the formation of the conductive material CM.

Figure 10:
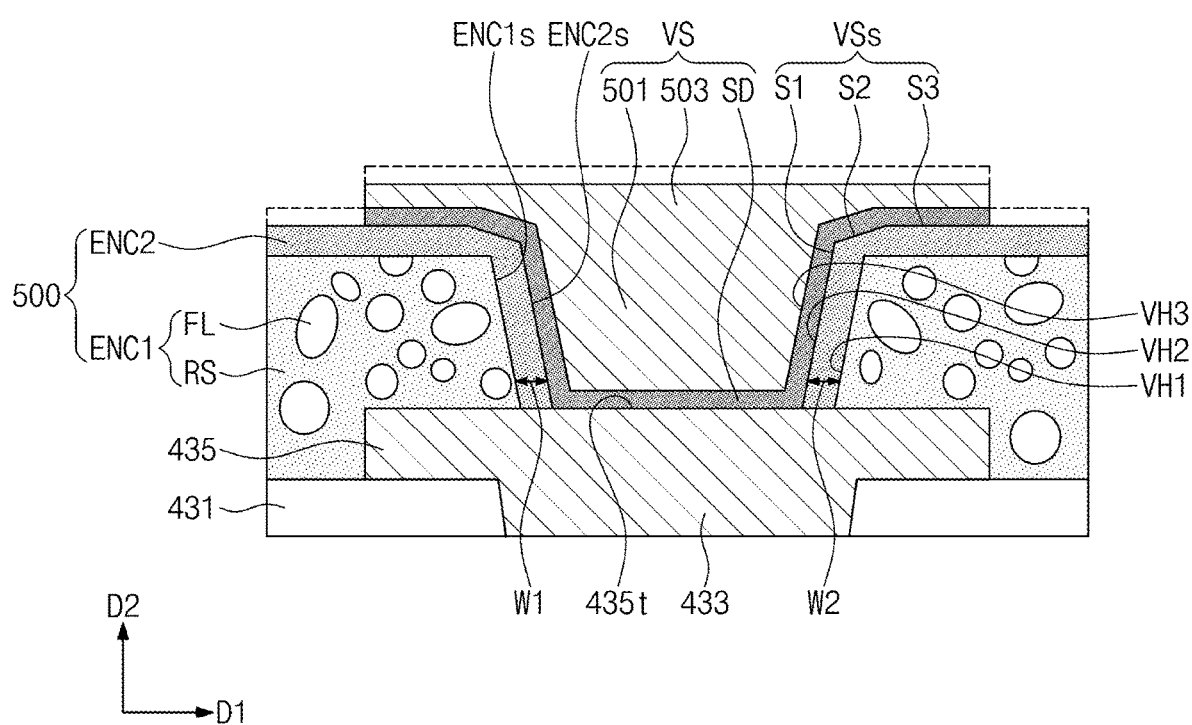
Figure 11:
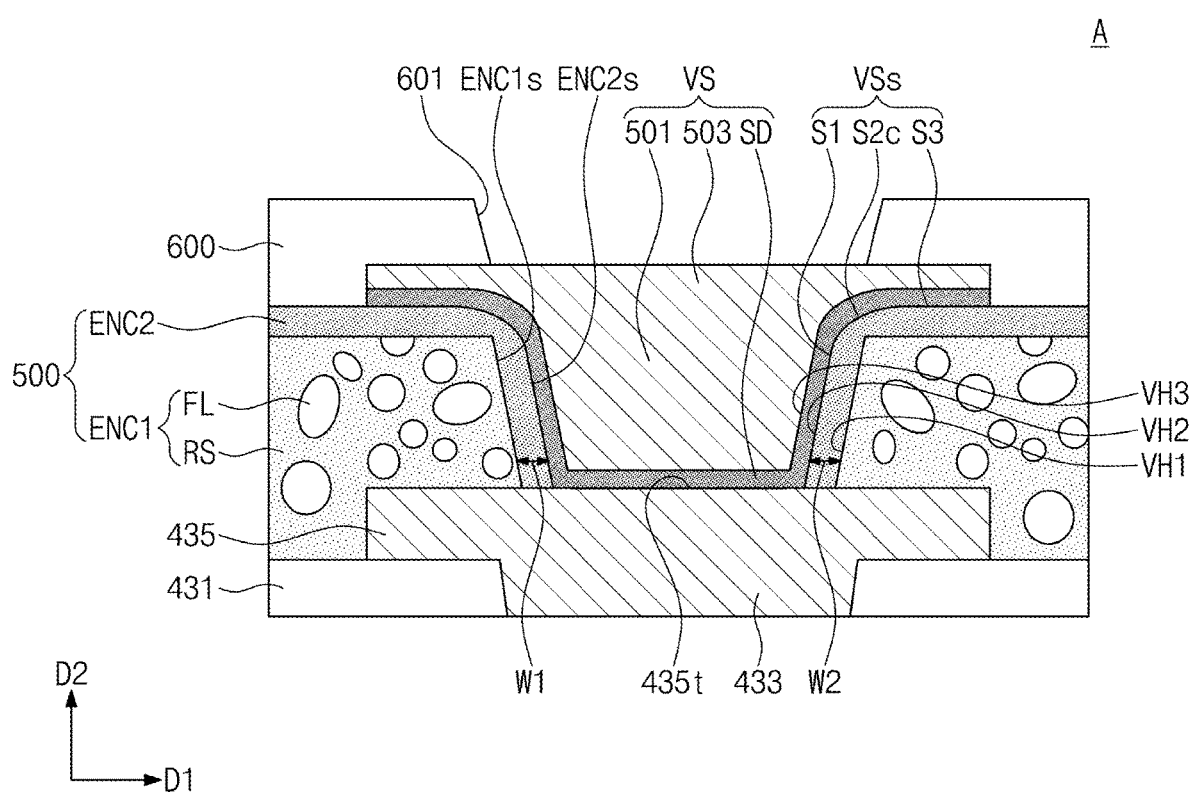
FIG. 11 is an enlarged view of the portion 'A' of FIG. 1 to illustrate a via structure of a semiconductor package according to some embodiments of inventive concepts.

Referring to FIGS. 9 and 10, an upper portion of the conductive material CM and a portion of the seed metal layer PSD may be etched to form a via structure VS. The via structure VS may include a seed layer SD, an upper conductive via 501, and an upper conductive pad 503. In the via structure VS, the upper conductive pad 503 may completely overlap with the seed layer SD in the second direction D2. A profile of a sidewall VSs of the via structure VS may be substantially the same as a profile of the seed layer SD and a profile of the sidewall ENC2s of the second encapsulation layer ENC2. In more detail, the sidewall VSs of the via structure VS may have first and second surfaces S1 and S2 having different gradients with respect to the top surface 435t of the third conductive pattern 435, and a third surface S3 on the top surface of the second encapsulation layer ENC2.

Referring again to FIG. 2, an upper insulating layer 600 may be formed on the second encapsulation layer ENC2 and the via structure VS. A portion of the upper insulating layer 600 may be patterned to form an opening 601 exposing a portion of the upper conductive pad 503. A width, in the first direction D1, of the opening 601 of the upper insulating layer 600 may increase as a height or level in the second direction D2 increases.

FIG. 11 is an enlarged view of the portion 'A' of FIG. 1 to illustrate a via structure of a semiconductor package according to some embodiments of inventive concepts. Hereinafter, the descriptions to substantially the same features and components as mentioned above with reference to FIGS. 1 to 10 will be omitted for the purpose of ease and convenience in explanation.

Referring to FIG. 11, a sidewall VSs of the via structure VS may have a first surface S1, a second surface S2c, and a third surface S3. More particularly, the first surface S1 may be inclined with respect to the top surface 435t of the third conductive pattern 435. Here, a gradient of the first surface S1 may be substantially constant. The third surface S3 may be substantially parallel to the top surface 435t of the third conductive pattern 435 and the first direction D1 in which the upper conductive pad 503 extends.

The second surface S2c may be a curved surface connected to the first surface S1 and the third surface S3. The second surface S2c may have a curved profile in a cross-sectional view of FIG. 11. A curvature of the second surface S2c may be less than a curvature of the corner of the first encapsulation layer ENC1. When the exposure process is performed by the UVDI exposure apparatus having the wavelength band in FIG. 6, the second surface S2c having the curved profile may be formed. In other words, at least a portion of the sidewall ENC2s of the second encapsulation layer ENC2 may be formed in a curved surface by the laser light having a wide wavelength band, and thus a portion of the sidewall VSs of the via structure VS may be formed in a curved surface.

Figure 12:
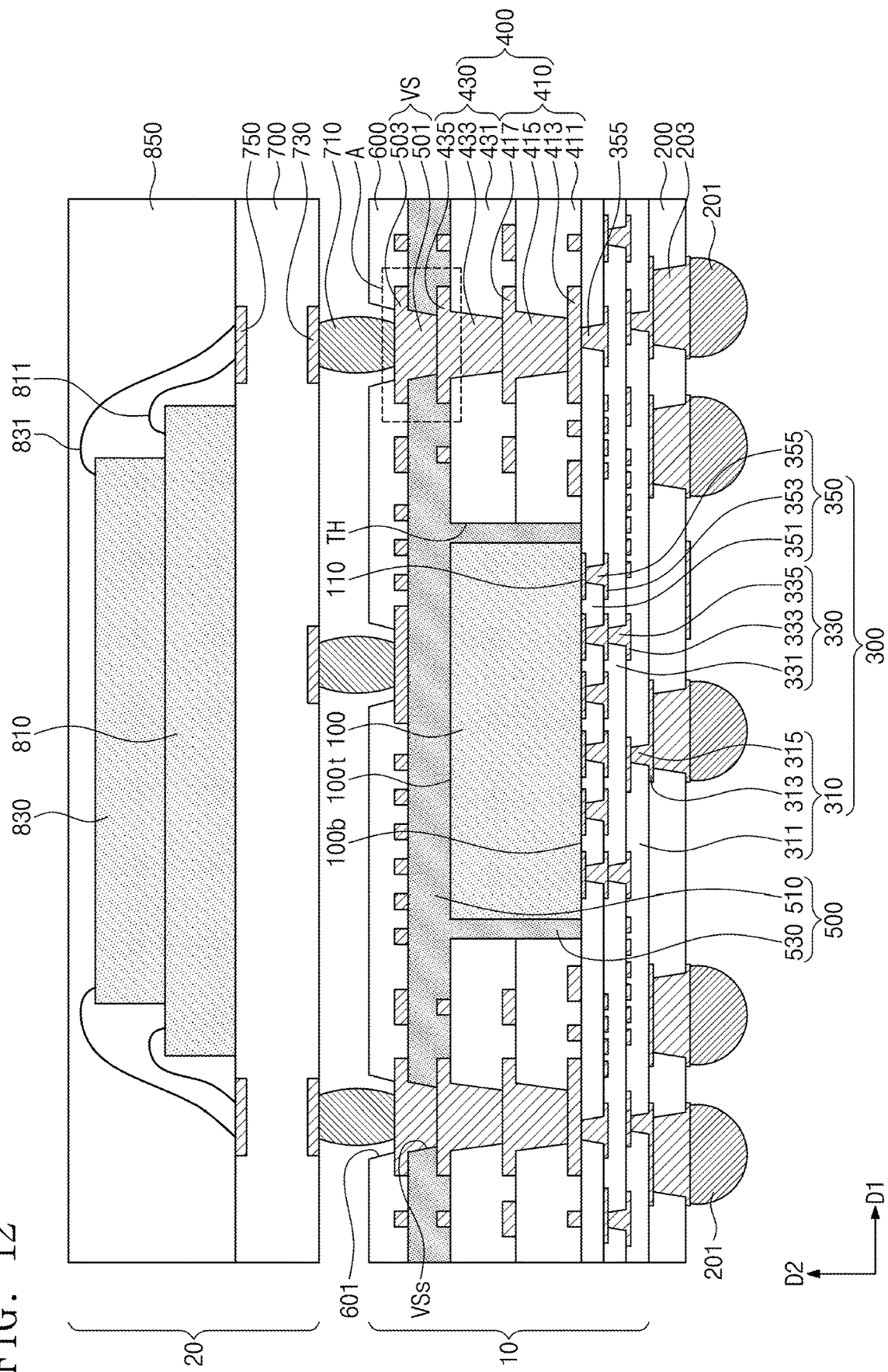
FIG. 12 is a cross-sectional view illustrating a semiconductor package according to some embodiments of inventive concepts.

FIG. 12 is a cross-sectional view illustrating a semiconductor package according to some embodiments of inventive concepts. Hereinafter, the descriptions to substantially the same features and components as mentioned above with reference to FIGS. 1 to 11 will be omitted for the purpose of ease and convenience in explanation.

Referring to FIG. 12, a semiconductor package according to some embodiments of inventive concepts may have a package-on-package (PoP) structure. In other words, a second semiconductor package 20 may be provided on a first semiconductor package 10. The first semiconductor package 10 may be the same as the semiconductor package described with reference to FIG. 1.

The second semiconductor package 20 may include an upper substrate 700, a first upper semiconductor chip 810, a second upper semiconductor chip 830, and an upper molding layer 850 covering the first and second upper semiconductor chips 810 and 830. For example, the upper molding layer 850 may include substantially the same insulating material as the molding layer 500 of the first semiconductor package 10.

The upper substrate 700 may be spaced apart from the upper insulating layer 600 of the first semiconductor package 10 in the second direction D2. A fourth conductive pattern 730 and a fifth conductive pattern 750 may be provided on the upper substrate 700. The fourth conductive pattern 730 may be provided on a bottom surface of the upper substrate 700 and may be electrically connected to the upper conductive pad 503 of the first semiconductor package 10 through a package connection member 710 including a conductive material. The package connection member 710 may be, for example, a solder ball. The fifth conductive pattern 750 may be provided on a top surface of the upper substrate 700. The fifth conductive pattern 750 may be electrically connected to the first upper semiconductor chip 810 through a first wire 811 and may be electrically connected to the second upper semiconductor chip 830 through a second wire 831. However, embodiments of inventive concepts are not limited thereto. In certain embodiments, the fifth conductive pattern 750 may be electrically connected to the first and second upper semiconductor chips 810 and 830 by at least one of other various methods.

Unlike FIG. 12, an additional interposer substrate may further be provided between the first semiconductor package 10 and the second semiconductor package 20. In addition, unlike FIG. 12, adhesive layers may further be provided between the upper substrate 700 and the first upper semiconductor chip 810 and between the first upper semiconductor chip 810 and the second upper semiconductor chip 830, respectively.

According to the embodiments of inventive concepts, the cross-sectional area of the via structure may be increased to improve the electrical characteristics of the semiconductor package.

In addition, according to the embodiments of inventive concepts, it is possible to prevent a crack from occurring at the via structure by stress, and thus the reliability of the semiconductor package may be improved.

Furthermore, in the method of manufacturing the via structure of the semiconductor package according to the embodiments of inventive concepts, the seed layer may be formed by the sputtering process, and thus a fine pattern may be formed by an environmentally friendly method.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A method of manufacturing a semiconductor package, the method comprising:
    forming a first substrate including a redistribution layer;
    providing a second substrate including a semiconductor chip electrically connected to the redistribution layer and an interconnection layer on the first substrate;
    forming a first encapsulation layer covering the second substrate; and
    forming a via structure penetrating the first encapsulation layer,
    the forming the via structure including forming a first via hole in the first encapsulation layer, forming a photosensitive material layer provided in the first via hole and covering a top surface of the first encapsulation layer, exposing and developing the photosensitive material layer in the first via hole to form a second encapsulation layer having a second via hole, and filling the second via hole with a conductive material,
    a surface roughness of a sidewall of the first encapsulation layer being greater than a surface roughness of a sidewall of the second encapsulation layer,
    the second encapsulation layer including a first portion conformally extending along the sidewall of the first encapsulation layer in the first via hole, a second portion inclined with respect to the first portion of the second encapsulation layer and a top surface of the first encapsulation layer, and a third portion extending over the top surface of the first encapsulation layer, and
    the first portion of the second encapsulation layer has a constant width such that the first portion has a same slope as the sidewall of the first encapsulation layer.

2. The method of claim 1, wherein
    the forming the via structure includes forming a seed layer after the forming the second encapsulation layer and before the filling the second via hole with the conductive material, and
    the via structure includes the seed layer.

3. The method of claim 2, wherein the forming a via structure includes forming the seed layer by performing a sputtering process.

4. The method of claim 2, wherein the forming the via structure includes forming the seed layer so the seed layer conformally covers a top surface of the interconnection layer exposed by the second via hole, the sidewall of the second encapsulation layer exposed by the second via hole, and a top surface of the second encapsulation layer.

5. The method of claim 1, wherein the first encapsulation layer includes an insulating resin and fillers in the insulating resin.

6. The method of claim 1, wherein the second encapsulation layer includes a photo-imageable dielectric resin.

7. The method of claim 1, wherein
    the exposing and developing the photosensitive material layer includes exposing the photosensitive material layer by performing an exposure process using a laser direct imaging (LDI) exposure apparatus or an ultraviolet direct imaging (UVDI) exposure apparatus.

8. The method of claim 7, wherein the LDI exposure apparatus uses a single-wavelength laser selected from a range of 380 nm to 420 nm.

9. The method of claim 7, wherein the UVDI exposure apparatus uses laser having a wavelength band of 300 nm to 500 nm.

10. The method of claim 1, further comprising:
performing a desmear process on a top surface of the interconnection layer and a sidewall of the first encapsulation layer, wherein
the top surface of the interconnection layer and the sidewall of the first encapsulation layer are exposed by the first via hole, and
the performing the desmear process is performed during the forming the via structure between the forming the first via hole and the forming the photosensitive material layer.

11. The method of claim 10, wherein
the first encapsulation layer includes an insulating resin and fillers in the insulating resin, and
wherein the desmear process removes portions of the fillers that protrude from the sidewall of the first encapsulation layer.

12. The method of claim 1, wherein
a top surface of the photosensitive material layer overlaps with the first via hole and is formed to be concave.

13. A method of manufacturing a semiconductor package, the method comprising:
forming a first substrate including a redistribution layer;
providing a second substrate including a semiconductor chip electrically connected to the redistribution layer and an interconnection layer on the first substrate;
forming a first encapsulation layer covering the second substrate; and
forming a via structure penetrating the first encapsulation layer,
the forming the via structure including forming a first via hole in the first encapsulation layer, forming a photosensitive material layer provided in the first via hole and covering a top surface of the first encapsulation layer, exposing and developing the photosensitive material layer in the first via hole to form a second encapsulation layer having a second via hole, and filling the second via hole with a conductive material,
a sidewall of the via structure having a first surface, a second surface, and a third surface,
the second surface extending from an end of the first surface to an end of the third surface,
the first surface of the sidewall of the via structure being inclined with respect to a top surface of the second substrate,
the second surface of the sidewall of the via structure being inclined with respect to each of the first surface of the sidewall of the via structure, the third surface of the sidewall of the via structure, and the top surface of the second substrate.

14. The method of claim 13, wherein the second surface of the sidewall of the via structure has a constant gradient with respect to each of the first surface of the sidewall of the via structure and the top surface of the second substrate.

15. The method of claim 13, wherein
the second surface of the sidewall of the via structure has a curved profile.

16. The method of claim 13, wherein
the forming the via structure includes forming a seed layer by performing a sputtering process after the forming the second encapsulation layer and before the filling the second via hole with the conductive material, and
the via structure includes the seed layer.

17. The method of claim 13, wherein
the exposing and developing the photosensitive material layer includes exposing the photosensitive material layer by performing an exposure process using a laser direct imaging (LDI) exposure apparatus or an ultraviolet direct imaging (UVDI) exposure apparatus.

* * * * *